United States Patent
Montijo

(10) Patent No.: US 6,934,646 B2
(45) Date of Patent: Aug. 23, 2005

(54) WAVEFORM COMPLEXITY DETECTOR

(75) Inventor: Allen Montijo, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 150 days.

(21) Appl. No.: 10/274,781

(22) Filed: Oct. 21, 2002

(65) Prior Publication Data

US 2004/0078157 A1 Apr. 22, 2004

(51) Int. Cl.[7] .............................................. G01R 13/00
(52) U.S. Cl. ............................ 702/66; 702/67; 702/78; 702/179; 702/180; 345/440.1
(58) Field of Search ............................ 702/57, 66, 67, 702/70, 75, 76, 78, 79, 179–181; 324/76.19, 76.22; 345/440–440.2; 708/313

(56) References Cited

U.S. PATENT DOCUMENTS

| | | | | |
|---|---|---|---|---|
| 4,183,087 A | * | 1/1980 | Huelsman | 327/91 |
| 4,516,246 A | * | 5/1985 | Kenemuth | 375/259 |
| 4,750,117 A | * | 6/1988 | Gregory | 702/171 |
| 5,495,168 A | * | 2/1996 | de Vries | 324/121 R |
| 5,550,963 A | * | 8/1996 | Siegel et al. | 345/440 |
| 5,740,064 A | * | 4/1998 | Witte et al. | 702/70 |
| 5,898,420 A | * | 4/1999 | Timm | 345/440.1 |
| 6,121,799 A | * | 9/2000 | Moser | 327/58 |
| 6,760,673 B2 | * | 7/2004 | Genther et al. | 702/75 |
| 2003/0218612 A1 | * | 11/2003 | Dobyns | 345/440 |
| 2003/0225315 A1 | * | 12/2003 | Merrett et al. | 600/300 |
| 2004/0017366 A1 | * | 1/2004 | Narita | 345/208 |
| 2004/0190793 A1 | * | 9/2004 | Rorvig et al. | 382/305 |

FOREIGN PATENT DOCUMENTS

JP          64029024 A    *   1/1989    ............ H03M/1/12

* cited by examiner

*Primary Examiner*—Marc S. Hoff
*Assistant Examiner*—Jeffrey R. West
(74) *Attorney, Agent, or Firm*—Edward L. Miller

(57) ABSTRACT

Trial decimations are performed on an acquired waveform. Each trial produces a sequence of packets applied to a complexity detection circuit. Each packet contains a decimation value to be used in place of acquisition values to be suppressed along a decimation sample width. Each packet also includes the maximum and minimum values that occurred within the associated decimation sample. A plurality of counters record for a trial decimation the number of instances when the differences in waveform extremes exceed a corresponding plurality of selected thresholds. Complexity introduced by decimation will tend to produce waveforms having larger voltage excursions over the region of suppressed acquisition samples. The data in the counters is processed to produce a suite of histograms examined to select a decimation factor that does not introduce significant additional complexity.

18 Claims, 3 Drawing Sheets

WAVEFORM COMPLEXITY DETECTOR

BACKGROUND OF THE INVENTION

There are several classes of electronic test equipment that digitize waveform data that is later presented in one form or another on a display. Typically, the acquired sample data is digitized and then stored in a rather large memory ("deep" memory is the favorite industry term), while some subset of the acquired data stored therein is formatted and then presented in the display. It is typical to further store the formatted subset in, and display it from, a much smaller memory called a frame buffer whose addressability and data characteristics more closely match those of the display mechanism. Digital oscilloscopes, eye diagram analyzers, logic analyzer and timing analyzers come to mind immediately as generally operating in this way, although there may be others. Of these, we shall say at the outset that we are more interested in the class of equipment that digital 'scopes and eye diagram analyzers fall into, more than the class containing logic and timing analyzers. On the one hand, a user of a 'scope or eye diagram analyzer has an interest in waveform integrity, and there are few boundaries on what can go wrong with a waveform: things that shouldn't be there are, and things that should be aren't. These "things" that are of interest appear as aspects of waveform shape and can be of short duration. We might be using test equipment that has internal digital operation, but make no mistake: we are interested in characterizing the analog behavior of some signal of interest, even if that behavior is supposed to obey digital rules. In recognition of this, 'scopes and eye diagram analyzers have high effective sample rates, so that a detailed trace of analog signal behavior can be observed. On the other hand, the user of a logic or timing analyzer resigns himself or herself to the idea that the data to be captured and studied is sampled at a SUT (System Under Test) clock rate, since data signal transitions are (supposedly) constrained to occur only at specified times relative to the SUT clock. The real use of these latter items of test equipment is to characterize an aspect of system behavior that is more "program oriented" and asks questions like "How long did this routine take?" or "Did this address ever get visited?" If genuine analog signal hygiene issues such as pulse width, delay, overshoot, ringing, loading or poor rise time, etc., are suspected, one turns to the classes of test equipment we are interested in: 'scopes and their brethren that tell us about actual (think: "analog") electrical behavior, and do so almost always as a function of time. (How else to consider the analog history of a waveform?)

All these described techniques are well and good, and can be taken as representative of such equipment for at least the last decade, perhaps almost two. Confining our interest now to the digital measurement of analog waveforms, we encounter another interesting aspect of how that class of test equipment operates. That aspect involves the "deep" acquisition memory on the one hand and the "display sized" frame buffer on the other. The disparity (which has incredible utility, to be sure!) gives rise to the notions of panning and zooming, which are ways of selecting which information in the acquisition memory is to be formed into a displayed image kept in the frame buffer. Panning is a sliding back and forth along the time axis at some degree of zoom (perhaps none at all), while the notion of zooming refers to stretching or compressing the time axis. Generally speaking, the width of the display in numbers of pixels is small compared to number of samples that can be stored in the acquisition memory, so if consecutively stored samples are displayed in consecutive pixel locations we say we are "zoomed in" all the way for "maximum magnification". (A misnomer to be sure, since we have no honest way to actually "magnify" details we didn't sample. "Maximum magnification" is really no magnification at all, and the art of "zooming" is mostly how to "zoom out", which is to say, compressing a segment of a waveform for display in X pixel locations that are fewer in number than the number of samples in the acquisition memory that are used to store that segment.) It is with respect to these issues that designers of digital 'scopes get creative to provide comfortable performance by the digital 'scope in areas (e.g., indicating transients shorter than a pixel's width while zoomed out) that the old analog 'scopes addressed (we won't say "solved") with bandwidth, writing rate and persistence.

We can illustrate the general nature of these issues with a hypothetical example. Suppose you wish to view several microseconds of data along a waveform (or two) where sub-nanosecond features are possible. The sample rate is one sample every 100 ps, the acquisition memory is sufficiently deep, but the display has only 1280 pixels in the horizontal direction. Clearly, to see the entire several microsecond's worth at one one time you will need to zoom out. To "zoom out" means that several consecutive samples are all represented by whatever can be displayed at a single horizontal pixel position in the display. The suspected sub-nanosecond features cannot be seen with clarity at this scale, suggesting that you may wish to zoom in some and then pan along the region of interest. Now, it is not that this strategy fails to work; it is effective. But it is not always convenient, and many times a user would prefer not zoom in and pan repeatedly, and yet be warned of instances of where lost resolution actually made a difference in the display. That is, a glitch-free slow moving signal would look just fine when viewed zoomed out, and much time could be wasted checking it while zoomed in, only to find nothing. The trick is to view, while zoomed out, a slow moving signal that does have a fast glitch and still notice that something is amiss, whereupon the user can subsequently zoom in if desired. To address this issue, test equipment designers have attempted to aid the user in drawing attention to sampled activity whose displayed trace undergoes significant abbreviation owing to the display being zoomed out. Possible techniques include intensification and blinking, with the most common being the illumination of several different pixels at different Y values, but all at the same X location. The idea is to suggest that several consecutive samples in the acquisition memory had significantly different Y values, and that the display is, at that X location, a stylized approximation. We might say that the acquisition data is too complicated for the horizontal resolution asked for.

Let us dwell on this for a moment. When a zoomed out version of a waveform is displayed and can be correctly taken as an accurate representation of the actual sampled version (which presumably accurately represents the real signal that got measured), what we might say is that the ("large") sampled version in the acquisition memory was successfully compressed to produce the "smaller" version in the frame buffer (and in the display). The term "compression" comes to us with an existing collection of meanings. In the data processing/computer environment, compression is a technique for taking advantage of some property that is equivalent to lack of randomness (e.g., recurring groups of bit patterns) to reduce the size of a corresponding, but still exactly correct, description. An indication of successful compression is when the compressed version can be uncompressed to re-create the original version with satisfactory fidelity. The notion of "satisfactory" varies with our expectations for the application. Mechanisms that compress and uncompress data on a hard disc expect no non-recoverable single-bit errors in several billion or so bits, and even then those errors are expected to be related to the storage medium and not attributable to the compression algorithm, which in and of itself, is exact. And you would be unhappy if your bank stored account information in a compressed form that rounded amounts down to the nearest dollar (even though that type of compression might be acceptable in another environment). Yet we are more tolerant of the ways our visual perception undergoes loss of resolution—there is usually an awareness that it is happening, and thus there can be some level of confidence that we are not being completely fooled, even though we do not know exactly what is missing. The point is that compressing a waveform for visual display is not the same kind of thing as what comes to mind when we think of "data compression" techniques. Waveform compression inherently runs the risk of loss of fidelity in the compressed version. In keeping with this tolerance for visual compression, an operator of a 'scope is expected to actually view and use the compressed version of a waveform, while no one in his right mind expects someone to read a printout of the compressed version of some document!

There is something else at work here, too. We might imagine an ideal 'scope that has really narrow trace width (but still maintains adequate brightness) and that waveform compression is performed by simply squeezing a trace that ought to be fifty feet in length into six inches. This is rather like slowing the sweep speed of a high bandwidth analog 'scope way down to, say, a second for the entire sweep, and then looking for microsecond excursions in the trace. Ignoring persistence issues (it's an ideal analog 'scope . . . ) what we would need is a magnifying glass, or even a microscope. We would be presented with a scene that contained features our eyes could not resolve, rather like the trees on a distant hill side. To see the trees we reach for a telescope. We do not complain that we cannot see the trees unaided, and think of our unaided view of the distant hill side as completely correct, which, in a very practical sense, it is. Similarly, our unaided view of the trace of this (imaginary) ideal analog 'scope is also correct, even if we need help to reveal its entire content. But we look to the 'scope to give us that help: To slide a microscope along the trace of the ideal 'scope in this example is equivalent to zooming in and then panning along the entire length of the trace, which we have already decided, absent some good reason to have to do it, is an inconvenience.

Certain practical limitations prevent realization of the ideal analog 'scope used in the above example. If one were to try that example with a real 'scope the trace would overwrite itself on adjacent excursions, owing to spot size being larger than the space between the excursions: trace resolution is effectively quantized, even in an analog 'scope! And it is definitely quantized in a digital 'scope. (Twice: once when digitized, and again for rendering in a field of discrete (X, Y) pixel positions.)

In a digital 'scope, it is when the waveform compression mechanism (zooming out) does not adequately cope with features in the original waveform (e.g., transients) that we are compelled to append to the displayed trace the aforementioned stylized indications, meaning that at such and such a location there occurred some uncompressible feature that does not pass gracefully through the quantization process.

A useful way to think about this issue is in terms of complexity. We can say that a waveform is too complicated for waveform compression if it cannot be "successfully" compressed by some desired method. The test for "successfully" is more apt to be "do we feel lied to" upon some subsequent discovery (an all too frequent feeling among users of early digital oscilloscopes), rather than an expectation that the compressed (zoomed out) version is somehow an exact miniature (in a time axis sense) of the real and uncompressed original. Viewed in this way, the notion of waveform complexity is a result that arises from unsuccessful waveform compression, and we shall say that waveform compression can introduce waveform complexity. As we proceed it will become clear that by "complex" we mean that a result of waveform compression is too simple, and that significant aspects of the original waveform have been lost.

We should guard against the natural tendency to equate "busy" or "ugly" with the term "complexity" as we will use it herein. A long original acquisition waveform of high bandwidth may, when zoomed in, show short bursts of overshoot, ringing, and assorted spikes of noise. We will accept it as "the truth," even though the trace is a fussy affair that we would never want to actually draw ourselves with pencil and paper. It is when we zoom out to get a nice clean waveform for that same signal, one that is simple and easy for us to draw with our pencil and paper, that we encounter complexity. The complexity arises because the nice pretty version is not really "the truth." Note that this does NOT mean that all zoomed out versions that are "pretty" or "simple" are also complex. The original waveform might indeed be "clean," so that considerable zooming out is possible before complexity sets in. It does suggest, however, that any waveform that has inflections, and no matter how clean, will eventually exhibit complexity if it can be zoomed out far enough. Note that we, as users of a 'scope, cannot merely look at a zoomed-out trace, in isolation, and decide if it is complex or not. Complexity is relative to what is was like before we zoomed out!

One might think an acquisition waveform could start out complex, with subsequent waveform compression producing an ambiguous result: either it stays complex, becomes more complex or becomes so abbreviated that it again appears non-complex at the expense of having lost significant detail. These are indeed legitimate consequences, save that in a digital 'scope the original acquisition record never starts out complex (at least not in the sense we are going to use the term), since digitizing is a time sequential operation that does not admit of producing two values for any one of the instances in the sequence. One might fabricate an "original" acquisition record or inherit one from another system—that was complex to begin with, but we are at present content to assume that our 'scope will never produce under its own power an original acquisition record that is complex to begin with.

To sum up this view of complexity then, actual waveforms are single-valued functions of time, and when digitized do not produce a complex acquisition record. That acquisition record might not be accurate (e.g., the sampling system had insufficient effective bandwidth), but that is a separate issue. (If your 'scope cannot digitize "the truth" then perhaps you have the wrong 'scope, or perhaps the problem at hand cannot be solved oscillographically.) A compressed version of an acquisition record, or of a subset thereof, might be complex, however, depending upon the nature of the uncompressed version, how much compression is desired, and how many horizontal pixel locations there are to display the compressed version. In this view, waveform complexity is a condition or an outcome that is introduced by waveform compression into a waveform record that is to be displayed. There may be times when there seems to be no choice other than to compress a certain amount, and suffer any complexity that results, while taking care to display the result in a way that renders the complexity without concealing it. On the other hand, there can be times when there is a choice about how much waveform compression to apply, where if we knew ahead of time that a given amount of waveform compression would produce a non-complex result but that any further compression would introduce complexity, we could chose to use the given amount of compression. In a very real sense we could claim to be using an optimum amount of waveform compression, and then perhaps adjust other system parameters to be in accordance with that optimum amount of compression.

"Decimation" is a term that has come into use to describe the regular substitution of a "decimation value" for every n consecutive samples of acquired data for use in the frame buffer (or for use in feeding data to some other process). For instance, one might simply take every $n_{th}$ sample in the acquisition record and discard the remaining n−1 adjacent samples. (That would be a rather drastic form of decimation, although it is possible, and is sometimes quite appropriate. There are additional and more sophisticated forms of decimation.) Decimation is clearly an attempt at waveform compression. There are times when the user's setting of the controls forces a particular "decimation factor" 'n' (where we replace a group of n-many samples with an associated decimation value), while there are other times where some supervisory system within the test equipment itself can automatically select it. And therein lies the problem of interest to us. Heretofore, there has been no good way to automatically select a decimation factor.

Why might an oscillographic or other waveform measurement system need a self-supplied decimation factor? While it is risky to speculate about the future uses of a new idea, there is at least one general case that can be readily identified at present. It falls into the category of "performance" and arises from the increasing prevalence of deep acquisition memories. Here are some examples.

A deep acquisition memory has certain consequences that arise from the time needed to visit all the necessary locations in the acquisition memory, which might range from about one tenth of a second to tens of seconds, depending upon the particular size of the memory and the nature of the operation (s) to be performed. Thus, even if a measurement is complete and the display is static (i.e., the 'scope is STOP'ed) the operator may perceive a definite sluggishness in simply panning and re-zooming the display. It is possible that we could alleviate that, at least in part, if there were an indicator of how much decimation could be applied while getting the data from the acquisition memory (as a strategy to reduce the number of memory access operations and the attendant data processing time). Of course, we don't want to "over decimate" the data, lest we ruin the fidelity of the result. On the other hand, an extreme zoom out can force just that. In a general sort of way, decimation and zooming out are essentially equivalent. If we knew the safe decimation limit for a particular segment of a record in the acquisition memory, the system could issue a general warning to the user, over and above any stylized indications in the trace itself, that the amount of zoom has exceeded the safe equivalent amount of decimation, and that the resulting display is perhaps not to be trusted. This warning is perhaps similar to the old "UNCAL" annunciator that lights on an analog spectrum analyzer (e.g., the HP 140/855X series) when the settings of the various controls for selecting resolution bandwidth, scan width and scan time conspire to prevent an adequate system response to possible excursions in the input signal.

Next, it sometimes happens that the user is interested in "waveform math" that displays, say, either the sum or difference of two signals. The old analog 'scopes did that stuff in real time with high bandwidth low drift analog techniques at the vertical front end. Digital 'scopes do not ordinarily have the requisite hardware to do such pre-storage combining, whether in an analog or digital manner, and digital 'scopes are therefore obliged to perform those tasks as post-data-acquisition processing.

There are, of course, advantages to post-acquisition processing. The desired combination can be performed as an afterthought, if need be, and the resources needed to perform it need not be of the expensive high speed variety. Also, post-acquisition mathematical operations in a digital 'scope can do things that are utterly impractical in an analog 'scope, such as displaying the average of four input traces. Post-acquisition math in a digital 'scope also allows displaying some function of just a single trace, such as $b^2$, $\sqrt{b}$, or even sin b, where "b" is a vertical input channel.

If the 'scope is STOP'ed then there is an initial delay for the requisite processing needed to perform the waveform math, which delay might also include a change in pan location or degree of zoom. This delay is perhaps annoying, but does not necessarily involve lost information. But if the mode is RUN and the idea is to repeatedly display the latest computed results (say, as an adjustment is being made), then the 'scope can have real problems. The rate at which the adjustment occurs might far exceed the rate at which results are computed and displayed, leaving the operator in a state of exasperated frustration. In this particular example it would be desirable to reduce the time required to perform waveform arithmetic by taking careful advantage of decimation performed on the operand waveforms prior to the operation itself. The general case is that we should like to find a way to subject a waveform to a variable degree of decimation and then use the decimated outcome as a substitute for the original whenever it is safe and advantageous to do so, say, for panning and zooming as well as for waveform arithmetic.

So what we need is a way to decide how much decimation a waveform is amenable to, without introducing a disagreeable loss of fidelity. This is not a complete cure for all ills, as it still won't enable us to put two gallons' worth of information in a one gallon display without something being lost (although it might help alert us to the loss). It can, however, allow us to confidently decimate the contents of a ten gallon acquisition memory to appear in the one gallon display as if they were really from a matching one gallon acquisition memory, whenever: (a) the 'scope settings require it; and, (b) the decimation results in "successful" waveform compression.

The decimation mechanism itself is philosophically easy to implement, and in its simplest form amounts to a scheme that increments consecutive addresses for the acquisition record by amounts larger than one, taking the addressed values and ignoring the rest. Such a direct scheme is perhaps too simple, however, as it complicates or even prevents the task of satisfactorily rendering complexity when it is produced. More sophisticated digital 'scopes have instead examined the data values to be ignored and allowed them to influence the (decimation) value that will be reported in their place. There are several known ways to do this, and for future convenience in the description that follows, we now briefly introduce one general way that decimation may be implemented, and which is similar to that used in the 54830 series of digital oscilloscopes from Agilent Technologies, Inc.

The idea is to examine all the values that are to be represented by a single decimation value, and then supply, instead of only such a single decimation value in isolation, a packet containing not only one decimation value of a particular kind (or sometimes also additional decimation values of different kinds), but other relevant values describing one or more useful aspects of all the adjacent acquisition data values that were examined and then suppressed in favor of the resulting decimation value. The degree of reduction in sample values is called the decimation factor. If n-many original acquisition samples are replaced by a single decimation value, then we say the decimation factor is n. It is sometimes convenient is to refer to the n-many samples that are suppressed or replaced by the resulting decimation value that is supplied in their place. Those n-many samples occupy a "decimation sample width" in an acquisition record being decimated. We can think of decimation sample width either in terms of a number of samples (n), or as the elapsed time interval corresponding to the acquisition of those n-many samples.

There are different ways to perform decimation, and there are accordingly different types of packets, and/or different types of data within a packet. Information about type is indicated by predefined type values in one or more type fields at particular locations within the packet. Packets of different types may have otherwise different internal structures and packet lengths. Data of different types is formatted and/or interpreted in different ways. For example, a packet conveying a decimation value that is an "average value" might contain a data item that is the arithmetic mean value for the examined acquisition values, accompanied by the number of samples used to form it and the associated standard deviation. Or, a packet might include, in addition to a decimation value of whatever sort, the maximum and minimum values that occurred in that part of the acquisition record to be represented by the packet. The intent of the packet type/data type mechanism is to provide not only a collection of decimation values for use by the rendering process that creates the actual displayed image, but also some ancillary context information related to the collection, so as to make that actual displayed image more satisfactory by providing such assistance to the rendering process. As a further example, some digital oscilloscope architectures even further decimate data that has already been previously decimated. It will be appreciated that the packet type/data type technique is a valuable tool for retaining and subsequently taking advantage of useful context information in such complicated architectures, particularly when large amounts of waveform compression are contemplated. (Among other things, it helps provide a way to preserve detected complexity against subsequent inadvertent simplification: a "once complex, always complex" rule, as it were, whose intent is to prevent a displayed trace of simple and innocent appearance from being a shameless and deceitful misrepresentation.)

Whether the decimation mechanism is simple or sophisticated, the trick is to discover, for the data of interest, the boundary between suitable and unsuitable decimation factors. To be sure, the operator may compel 'scope settings that require more decimation than can be safely performed, or that force more waveform compression than can be accommodated without significant loss of fidelity. But these case are usually the extremes rather than the norm (and if the 'scope knew the limit was being exceeded it could display a warning). Additionally, there are many other times in an oscillographic waveform measurement system, especially one having a deep acquisition memory, when an informed choice for a decimation factor would improve performance for waveform math, re-zooming or panning along a displayed trace. What to do?

SUMMARY OF THE INVENTION

A suite of trial decimations is performed on a waveform that has been previously acquired and stored by test equipment. Each instance of the decimation process produces a sequence of packets that can be used for waveform rendering, waveform arithmetic, or other such process. Each sequence of packets for a trial decimation is also applied to a complexity detection circuit that produces an indication of the complexity of the resulting decimated waveform. Each packet in a sequence contains a decimation value to be used in place of acquisition values to be suppressed along a decimation sample width determined by a decimation factor. Each packet also includes the maximum and minimum values that occurred within the associated decimation sample width along the acquisition record. A number of counters (say, for example, sixteen) record for a trial decimation the number of instances when the differences in waveform extremes for the associated decimation sample widths exceed a corresponding number of (sixteen) selected thresholds. Complexity introduced by decimation will tend to produce waveforms having larger voltage excursions over the region of suppressed acquisition samples. The data in the counters is processed to produce a histogram corresponding to the decimation factor used. A suite of likely trial decimation factors is used. The histograms for trial decimations of varying trial decimation factors are compared to determine the relative amounts of complexity that varying degrees of decimation introduce. The resulting suite of histograms can be examined to assist in selecting an actual decimation factor that does not introduce significant additional complexity into the resulting decimated waveform. That selected actual decimation factor is then used for a subsequent post data-acquisition data-manipulation operation and/or in formatting a displayed subset of the acquired data. The sixteen counters may be configured to operate on one or two channels of data, to produce one sixteen-cell or two eight-cell histograms, respectively.

DESCRIPTION OF A PREFERRED EMBODIMENT

Figure 1:
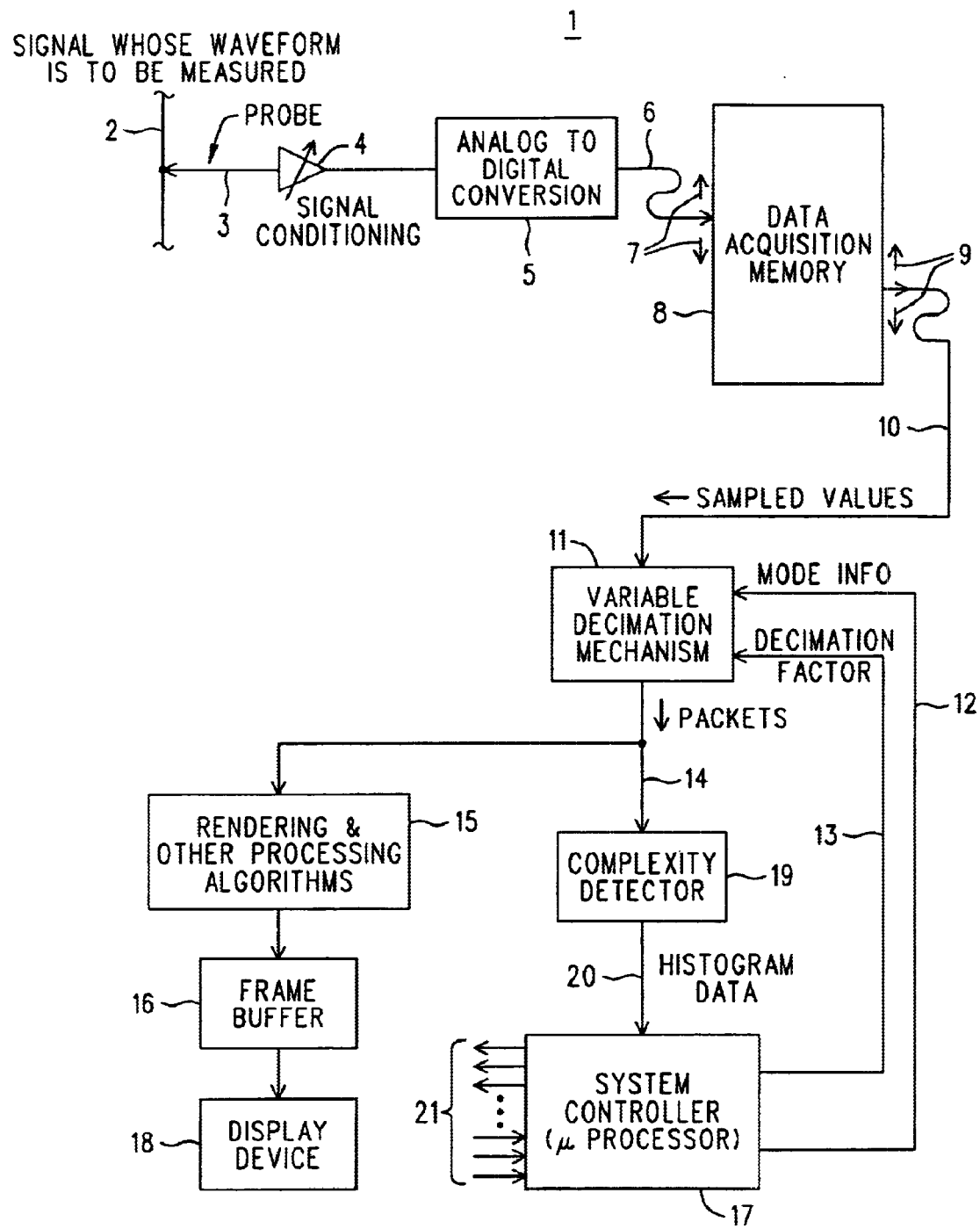
FIG. 1 is a simplified block diagram of a digital waveform acquisition and display system that incorporates decimation of the acquisition record and complexity detection for the decimated result.

Refer now to FIG. 1, wherein is shown a simplified representation 1 of a block diagram of a digital waveform acquisition and display system, such as might be found in a digital oscilloscope, or other similar pieces of test equipment. Of course, when formulating FIG. 1 we had a particular topic in mind, and grouped various internal operations in ways that facilitate an explanation of that topic, so that certain expected functions may seem buried or suppressed (e.g., "Where do I set the trigger level?"). Fortunately, for the present purpose we don't need to examine every function one would normally expect to find in a 'scope, and that has allowed us to simplify the block diagram 1, the better to concentrate on the things that are of interest. Those things concern data flow through a variable decimation mechanism and the examination of the result with a complexity detector. We assume that the reader otherwise has at least a modest acquaintance with the basic conventional architectures of digital oscilloscopes.

To continue, then, we assume that there is some signal 2 whose waveform is to be acquired and displayed. A probe 3 of a suitable nature (a probe is not explicitly depicted, only where it would be) is disposed to be in electrical (or optical) contact with the signal 2. A signal conditioning mechanism 4 (e.g., impedance conversion, amplification, attenuation, filtering, etc.) prepares the signal for application to an Analog To Digital Converter 5 operating at some suitable rate, and from whence emerges a stream of digital sample values 6 that are the essence of the measurement. The digital sample values 6 are stored in a Data Acquisition Memory 8 in locations determined by an addressing and memory cycle mechanism 7. In all candor, we are indeed simplifying quite a bit here, and are glibly ignoring the various performance producing tricks involving buffering and interleaving of n-many slower speed paths to synthesize one apparent high speed path operating n-times as fast. No matter, however the 'scope works (and there are different ways, depending on performance requirements and cost constraints) the data does eventually get into the Data Acquisition Memory 8. That memory is typically dual-ported, and a different addressing and memory cycle mechanism 9 allows stored sample values 10 to be retrieved in a random access manner and at a rate suitable for processing by a system based on a merchant microprocessor.

We show the sampled values 10 as being passed to Variable Decimation Mechanism 11 that is responsive to MODE INFO 12 and a DECIMATION FACTOR 13 that originate with a System Controller 17 that is essentially a microprocessor. It will be appreciated that, although we haven't shown it explicitly, the sampled values 10 may also be available to other data processing subsystems without having to first pass through the Variable Decimation Mechanism 11. However, sampled values that do pass through the Variable Decimation Mechanism emerge as packets 14 as determined by the MODE INFO 12 and the DECIMATION FACTOR 13. For the sake of explanation, let us assume that some consecutive number (S·N) of sampled values 10 are applied to the Variable Decimation Mechanism 11. It is sufficient for us to think of a packet as a condensation of some consecutive number N of those sampled values 10 into one (or maybe more) decimation value(s), perhaps accompanied by some context information describing something about the N-many values that filled the decimation sample width. The value N is, of course, the decimation factor that is in use. One possible value for S is the number of horizontal pixel positions we are prepared to use in rendering the displayed trace. On the other hand, however, S might be larger, so that S·N corresponds to the entire acquisition record (i.e., the entire waveform was decimated). The System Controller 17 decides such issues, based on the operator's manipulation of the instrument's controls.

It will be appreciated that the Variable Decimation Mechanism 11 can be adjusted such that it effectively does not decimate, but preserves the sampled values 10 in their original state, if that is needed. And it will also be appreciated that, even though we have not shown it, one or more sequences of packets representing the decimation of a waveform with different decimation factors can be stored in a memory for future use without having to subsequently recreate them.

In any event, the collection of packets representing some degree of decimation is available to a mechanism 15 for Rendering And Other Processing Algorithms. Mechanism 15 represents many of the "features" that may be applied to the acquired data and that are much of what the user thinks his 'scope "does" to earn its keep. Once a degree of decimation has been determined (a desired final value for the DECIMATION FACTOR 13 has been arrived at), the corresponding sequence of packets is sent to mechanism 15 for rendering or other processing (i.e., is either sent from Variable Decimation Mechanism 11 or read from memory). The processed waveform data is then written into a Frame Buffer 16, from whence it is used to create a viewable image on a Display Device 18.

The collection of packets 14 is also applied to a Complexity Detector 19, about which we shall have more to say in connection with other figures. At this point it is sufficient to say that it is responsive to waveform complexity in the sense described in the Background And Summary, and that it produces HISTOGRAM DATA 20 that is applied to the System Controller 17. In short, when an optimum degree of decimation is being sought for data already in the Data Acquisition Memory 8, the System Controller will set a trial decimation factor as the value for DECIMATION FACTOR 13, cause the sampled values of interest to pass through the Variable Decimation Mechanism 11 to produce associated HISTOGRAM DATA 20, which is then in due course examined by the System Controller in conjunction with subsequent HISTOGRAM DATA corresponding to subsequent other trial values of the DECIMATION FACTOR. The expectation is that after some number of trial decimations the respective histograms will indicate that an optimum value for the DECIMATION FACTOR 13 has been found. That value is then used as the decimation factor for the production of the sequence of packets to be processed at mechanism 15.

In final reference to FIG. 1, note the various signals 21 that originate with, and are applied to, the System Controller 17. These are meant to indicate in a general way that the System Controller 17 is a firmware-driven embedded system that controls most everything that needs controlling, from trigger level, where the displayed trace starts relative to the trigger (delay), volts per division and time per division, how many traces (which data channels) are displayed, and that also performs any waveform math, etc. We mean to indicate with signals 21 that the System Controller 17 can be responsive to conditions in the data, as well as to the settings of the controls on the instrument's front panel, and that it determines the state of various indicators and annunciators, as well as how the acquired waveform data is seen in the display.

Figure 2:
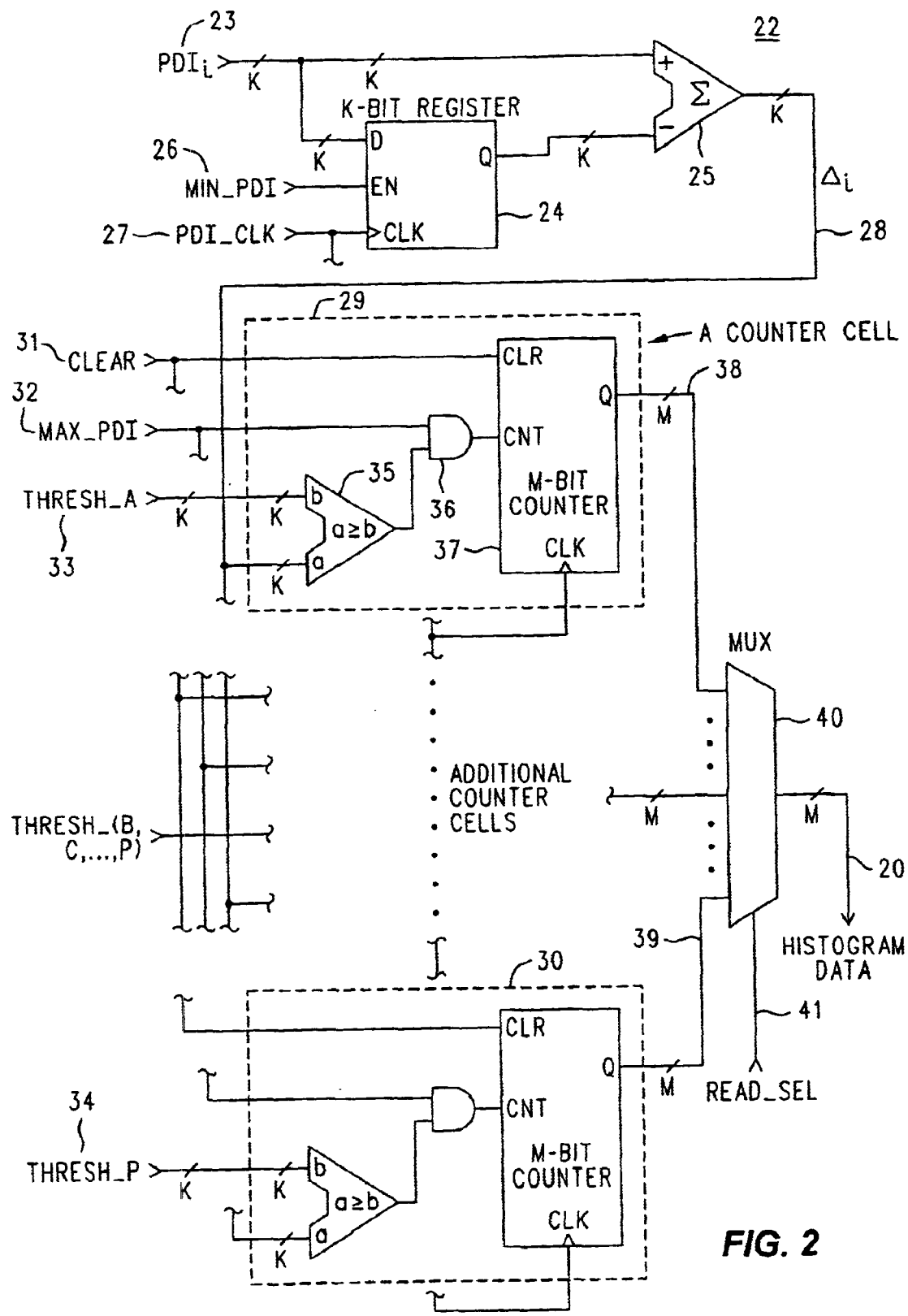
FIG. 2 is a simplified block diagram of the complexity detector circuit of FIG. 1.

We turn now to FIG. 2, wherein is depicted a simplified block diagram 22 of a complexity detection circuit constructed in accordance with the principles of the invention. Perhaps the best place to begin an explanation is with the signal $PDI_i$ 23. "PDI" stands for "Packet Data Item," and these are values that appear on a k-many-bit wide bus that conveys, in some sequential order resulting from the way the packet was constructed and the operation of a packet reading mechanism, the individual data items (the $PDI_i$) that are contained within a packet. As previously mentioned, packets have internal structures, and the various PDI within a packet have different meanings. The various $PDI_i$ are assumed to include actual decimation values produced in earnest by the Variable Decimation Mechanism 11, rather than being simply original sampled values 10. That is, it is most probable that a trial decimation factor has been used to find the various $PDI_i$ in the packets to be processed. In any event, the circuit of FIG. 2 has been arranged to operate with packets having certain properties, which we will now describe.

First, let's dispose of the issue of packet length. Each packet will, of course, have some definite length. They might all be the same, or they might be different. The circuit of FIG. 2 does not need to know the length, although other sub-systems within which the complexity detection is being performed might need to know it. There are several ways that this could be done, among which are: (1) All packets are of the same known length. (2) This is the nth packet and the system already knows it is the nth one and maintains a table that tells length, given a packet number. (3) The system might not already know packet number, but the packet has a header that tells what number packet it is. (4) There might not be any such length table maintained by the system, and the packet has a header that tells its length, and number if necessary. (5) And so on, including the notion of indicating different types of packets. Packet type may well affect how length is understood, and so on. What we gain from this is that the system will read the sequentially ordered data items of a packet, producing the various $PDI_i$, until it has read them all. If there is a packet header, then, for purposes of this explanation, the header is extracted first, used as meta information about the rest of the packet, and is probably not included in the $PDI_i$. In short, we acknowledge the existence of a mechanism that gracefully fetches packets from within a sequence thereof, and then reads their contents, which then appear as the various values $PDI_i$ 23, and that these values are k-many bits in width. We have not shown such a mechanism in FIG. 2, but the reader will have no difficulty appreciating how that sort of thing is done. It could be accomplished with a data structure in random access read write memory and associated code executed by a microprocessor for an embedded system, or, by dedicated circuitry in an ASIC (Application Specific Integrated Circuit). We prefer the latter, as it runs faster, and leaves the System Controller 17 free for other duties.

So, there will be asserted, probably in order as their decimation values would appear along the time base, S-many groups of $PDI_i$. (One group per packet, and S-many packets.) The circuit of FIG. 2 does not need to know how any particular decimation algorithm produced those $PDI_i$ for a group, but it does assume that one of them is a maximum value and that one is a minimum value. That is, one of the $PDI_i$ is the maximum sampled value, and another one is the minimum sampled value within the decimation sample width associated with that packet. Furthermore, it assumes that those two particular maximum and minimum PDI have already been identified as part of the decimation process that produced the packet, and that the identification is part of what is in the packet. The identification will be used to control the values for two signals: MIN_PDI 26 and MAX_PDI 32. MIN_PDI will be TRUE whenever the particular PDI being presented conveys the minimum value, while MAX_PDI will be TRUE for a PDI conveying a maximum value. The Complexity Detector 22 of FIG. 2 is arranged in a way that requires that the signal MN_PDI 26 and its associated PDI occurs before MAX_PDI 32 and its associated PDI occurs.

There are various ways the signals MIN_PDI 26 and MAX_PDI 32 can be generated, ranging from simple to complex. One simple way is to simply force the PDI's for the maximum and minimum values to be in specific locations within a packet, say, at as the second and third PDI's. Then when i equals its second ordinal value MIN_PDI is driven TRUE. MAX_PDI would be driven TRUE when i equaled its third ordinal value. (We say it this way, since some people start an index at zero, while others prefer to start at one . . . .) We suspect that this is too simple, as it might interfere with the future definition of other types of packets having a changed internal format, and consequently with the ability of the Complexity Detector 19 to operate with such packets.

Another way would be to have index values in the header. In that case, there would be at least two index values, one for indicating where in a packet a maximal PDI is located, and a similar one for a minimal PDI. This technique then matches the current value of i against each index value, and sets to TRUE the appropriate one of MIN_PDI and MAX_PDI whenever an equality occurs. The index value comparison technique works, and for long packets (many PDI) it uses fewer bits than the preferred technique described next. On the other hand, some might see it as cumbersome.

Another technique is preferred instead, especially so when the packets are fairly short and the Complexity Detector (19, 22) is an ASIC. It is that each of the $PDI_i$ is two bits wider than needed to represent the numerical value of those $PDI_i$. In the figure we show the $PDI_i$ as being k-many bits wide. It is common for the PDI to be eight-bit values, and for k to accordingly be eight. What we are saying now is that while still in the packet they are each really ten bits in width, and that two of those bits, say the two most significant, are used as "tag bits" to indicate maximum and minimum. As the $PDI_i$ are extracted from the packet and presented as individual values for the sequence of PDI's in the packet, the two extra bits are stripped off and used to set associated values for signals MIN_PDI 26 and MAX_PDI 32. Those two signals 26 and 32 are then taken in conjunction with their associated eight-bit PDI's.

As previously mentioned, the Complexity Detector 22 of FIG. 2 requires that MIN_PDI 26 occurs prior to the occurrence of MAX_PDI 32. This might be otherwise, but as it is, this simplifies the operation of the Complexity Detector without placing an undue burden on the Variable Decimation Mechanism 11 during the construction of the packets.

Another housekeeping signal is produced during operation of the (unshown) mechanism that fetches packets and then reads their contents, which then appear as the various values $PDI_i$ 23. That other signal is PDI_CLK (27), which stands for PDI CLOCK. It is TRUE each time a next instance of the $PDI_i$ is presented.

To continue with the explanation of FIG. 2, then, note that the $PDI_i$ are applied to the D inputs of a k-bit register 24 that is clocked by PDI_CLK and enabled by MIN_PDI 26. This captures the minimum value of the decimation sample width associated with the current packet in the sequence.

At some subsequent time, perhaps the next instance of PDI_CLK or even later, another $PDI_i$ will occur with an accompanying MAX_PDI 32. Now two things of interest happen. First, the minimum value already captured in register 24 is applied to a (−) input of a Summer 25 whose (+) input is coupled to the $PDI_i$. The captured minimum value is subtracted from the maximum value by Summer 25 to produce a k-many bit difference $\Delta_i$ 28. (Any $PDI_i$ will produce a $\Delta_i$ 28, but this is the one that will get used. Read on.) Second, $\Delta_i$ 28 is applied to each of a number (sixteen, in our example) of Counter Cells (29, . . . , 30). There they are compared by Comparators (35) against a corresponding number (sixteen) of selected thresholds (THRESH_A 33, . . . , THRESH_P 34). If MAX_PDI 32 is TRUE, only then will a value of $\Delta_i$ 28 that equals or exceeds the threshold for the associated Counter Cell be allowed to increment the count of the cell. Each Counter Cell has its own M-Bit Counter 37. The count in each of the Counter Cells is set to zero by a signal CLEAR 31 at the start of the sequence of packets. When the entire sequence of packets has been applied to the Complexity Detector the various counts (38, ..., 39) are read out via a MUX 40 controlled by a READ_SEL selection signal (41) to produce (sequentially presented) HISTOGRAM_DATA 20. The signal READ_SEL is controlled by the mechanism that investigates the histograms and determines complexity. That mechanism is preferably a program executed by the System Controller 17.

An interesting issue concerns waveform arithmetic on two channels. It is almost a certainty that their acquisition records were obtained with the same sampling strategy. That is, both records cover the same interval in time, and they have the same (or very nearly so) number of samples. Some minor interpolation may be needed to get the samples to "line up" before they are used as operands in the same operation, but all that is understood and is conventional. If records are to be decimated to improve performance, then they ought to both be decimated by the same amount and (probably) in the same general way. The amount might well be determined by which one tolerates the least amount of decimation. The implication is that trial decimations for both ought to be judged for complexity according to the same general rules. Those considerations, as well as performance considerations (the time required suggests having two Complexity Detectors) and cost considerations (perhaps two full-time sixteen-threshold Complexity Detectors is extravagant, while a system of two Complexity Detectors each with eight thresholds is acceptable) lead us to contemplate a configurable Complexity Detector.

The idea behind a configurable Complexity Detector is that it could do a full Q-many thresholds when only one channel was being investigated, and an acceptable compromise of Q/2 (or Q/3 or Q/4) many thresholds when two (or three, or four) channels were to be investigated. Of course, a top-of-the-line four channel 'scope might have two configurable sixteen threshold Complexity Detectors, so that in a two channel case each channel gets a full sixteen-threshold complexity determination, while in a four channel case each channel gets eight thresholds. Alternatively, Q might be larger than sixteen, say thirty-two or even sixty-four, and there might be just one or an actual plurality of Complexity Detectors, re-configurable or not, as is appropriate.

Accordingly, it will be appreciated that the circuit 22 of FIG. 2 can, in a presently preferred embodiment, be configured to operate as one sixteen-threshold Complexity Detector, as is shown, or as two separate eight-threshold Complexity Detectors (a configuration not shown). How to do this kind of re-configuration is well known, and involves, prior to applying signals that are to be duplicated at or removed from any of several places, conditioning the assertion of those signals with gating that corresponds to the desired rearrangement of the circuit block diagram.

In further consideration of FIG. 2, we shall touch briefly on a number of issues related to obtaining and using the HISTOGRAM_DATA 20. First, it will be appreciated that the counts in the to a genuine histogram. To see this, suppose for the sake of explanation, that THRESH_A 33 is the Counters 37 need to "separated" before they can be used to populate a data structure that is equivalent to a genuine histogram. To see this, suppose for the sake of explanation, that THRESH_A 33 is the lowest threshold, THRESH_B is the next highest, and so on, with THRESH_P 34 being the highest. It is clear that an event that increments the Counter (not explicitly shown in the figure) for THRESH_B also increments the Counter 37 for THRESH_A. In like fashion, an event that increments the Counter for THRESH_P (the one in Counter Cell 30) also increments all the other Counters as well. This follows from the fact that a value for $\Delta_i$ 28 that equals or exceeds the highest threshold also exceeds any lower threshold. So, the mechanism that populates a data structure representing a histogram can use the count for the highest threshold (THRESH_P in this explanation) as it appears, but must find the count for THRESH_O (which has the next lowest threshold) by removing from its Counter the count that occurred in the Counter for THRESH_P (for Cell 30). The count originally associated with THRESH_N must be adjusted by removing the sum of the (corrected) counts for both THRESH_O and THRESH_P and so on. Finally, the count produced for THRESH_A in Counter 37 must be adjusted by removing the sum of the corrected counts for all the other Counters.

The separation of counts just described may be performed by software executed by the System Controller 17 as a preliminary operation in preparation for histogram construction. In this case HISTOGRAM _DATA 20 would be a sequence of unseparated count values from the various Counters 37. Alternatively, the subtractions needed to perform the separation could be performed by dedicated hardware in the ASIC containing the circuitry of the Complexity Detector. In such a case it is preferred that the needed summation and subtraction mechanisms be located between the various Counters 37 and the inputs to the MUX 40. In this arrangement the inputs to the MUX would be the separated counts and the output of the MUX would be the individual separated counts presented in a sequence arranged by the values of READ_SEL 41 that are applied to the MUX 40.

We have shown and described a specific manner of comparison performed against the various threshold signals (33, ..., 34) by the associated comparators 35. In particular, we have described the comparison as "is the count greater than or equal to the threshold . . . ?" It will be appreciated that other types of comparison could be employed here, as well. It will further be appreciated that the manner in which the comparisons are performed (>instead of $\geq$) may have a collateral effect on the way that the above described separation is accomplished. As a further example, if pairs of comparators each receiving endpoints of non-overlapping ranges (i.e., a true partition) were arranged as range detectors coupled to their associated Counter, then the various Counters 37 would contain values that are already separated, and would directly represent a histogram. In fact, the comparators needed to perform an actual partition are just those shown in the figure, and the addition of some further circuitry would detect separate non-overlapping ranges. One way to do this, assuming that the thresholds THRESH_A, THRESH_B, etc., are in order of increasing value, is to supply each preceding Counter Cell (for THRESH_A) with the negation of the comparator (35) output of its successor Counter Cell (for THRESH_B), and to apply that negated signal as an additional input to the AND gate (36) of the preceding cell (for THRESH_A). Thus, a Counter Cell won't increment unless its own comparator is tripped (as before) and also unless the comparator in the succeeding Counter Cell is not tripped. A logical inversion (negation) of THRESH_C's comparator would be feed back to the Counter Cell for THRESH_B, and so on. The Counter Cell (30) for the highest threshold (THRESH_P) is left as is, since there is no next higher threshold.

Next, there is the issue of what the various thresholds ought to be. For most signals it is preferred that the various thresholds (THRESH_A:P 33, . . . , 34) be spaced apart in an exponential fashion, which it will be appreciated, will produce a logarithmic histogram. In any event, the threshold with the lowest value ought to be large enough that it does not produce counts caused by the general level of noise associated with the signal. The threshold with the largest value should be smaller than the largest expected signal value, or if that information is not at hand, one half of the allowed (full scale) signal range.

One way that the thresholds can be spaced apart is given by the equation:

MIN_THRESH·$X^{(n-1)}$=MAX_THRESH, where n is the number of thresholds.

Solving for X:

$X$=(MAX_THRESH/MIN_THRESH)$^{(1/(n-1))}$

So, for example, if:

n=16

MIN_THRESH=5, and

MAX_THRESH=150, then

X=1.2545 and the $j_{th}$ threshold is set to 5·(1.2545$^{j-1}$).

It will be appreciated that other rules for determining threshold spacing are possible (e.g., a uniform spacing or some other linear spacing, perhaps for signals whose Y axis is already logarithmic). In particular, the thresholds could be spaced apart based on the actual maximum excursion exhibited by the signal, as opposed to the particular full scale value allowed by the current volts per division settings.

Now let's consider another example, say, for a two channel case with eight thresholds for each channel. Suppose that we decide to detect a smallest $\Delta_i$ of four, and to select the thresholds in a geometric sequence such that the ninth threshold (if there were one, although there is not) would be a largest $\Delta_i$ of two hundred fifty-six. This leads us to write:

4($X^8$)=256, or $X^8$=64, or

X=1.6818.

Then, for the $j_{th}$ threshold (j=1, 1, . . . , 7):

4·(1.6818$^{j-1}$)=4, 7, 11, 19, 32, 54, 91 and 152 (after rounding).

A final issue involves how to interpret the histograms after they have been constructed. We must decide upon a "weight" for each cell or "bucket" within a histogram. The idea is that if a cell corresponds to a $\Delta_i$ of 150 rather than to only 50, it represents a worse (more severe) condition that a mere 50 does. We suspect that it probably is three time times worse. So it seems reasonable to weight the cells by the same powers that produced the thresholds. For the preceding two channel nine-threshold example those weights would be:

1, 1.6818, 2.8284, 4.7568, 8, 13.4543, 22.6274, and 38.0546.

Now, let us define the "complexity" $C_i$ of the $i_{th}$ trial decimation for a waveform as the sum of all the weighted cell amplitudes divided by the number of packets processed to create the associated ($i_{th}$) histogram. To continue with the most recent example:

$C_i$={(hits$_i$[4:6])(1)+(hits$_i$[7:10])(1.6818)+ . . . +(hits$_i$[152:255])(38.0546)}/# packets.

We now compare the various $C_i$ against a value Z selected to distinguish "too complex" from "not too complex". Z might be chosen to represent a fixed percentage of the interval spanning a minimum value of the $C_i$ and a maximum value of the $C_i$. If $C_i$>Z, then the $i_{th}$ trial decimation associated with that waveform produced a decimated waveform that is too complex.

There are also other criteria that could be used to identify complexity. We could, for example, say that a decimated waveform is too complex if the amplitude for a selected cell in the histogram exceeded a certain value, or was non-zero.

Figure 3:
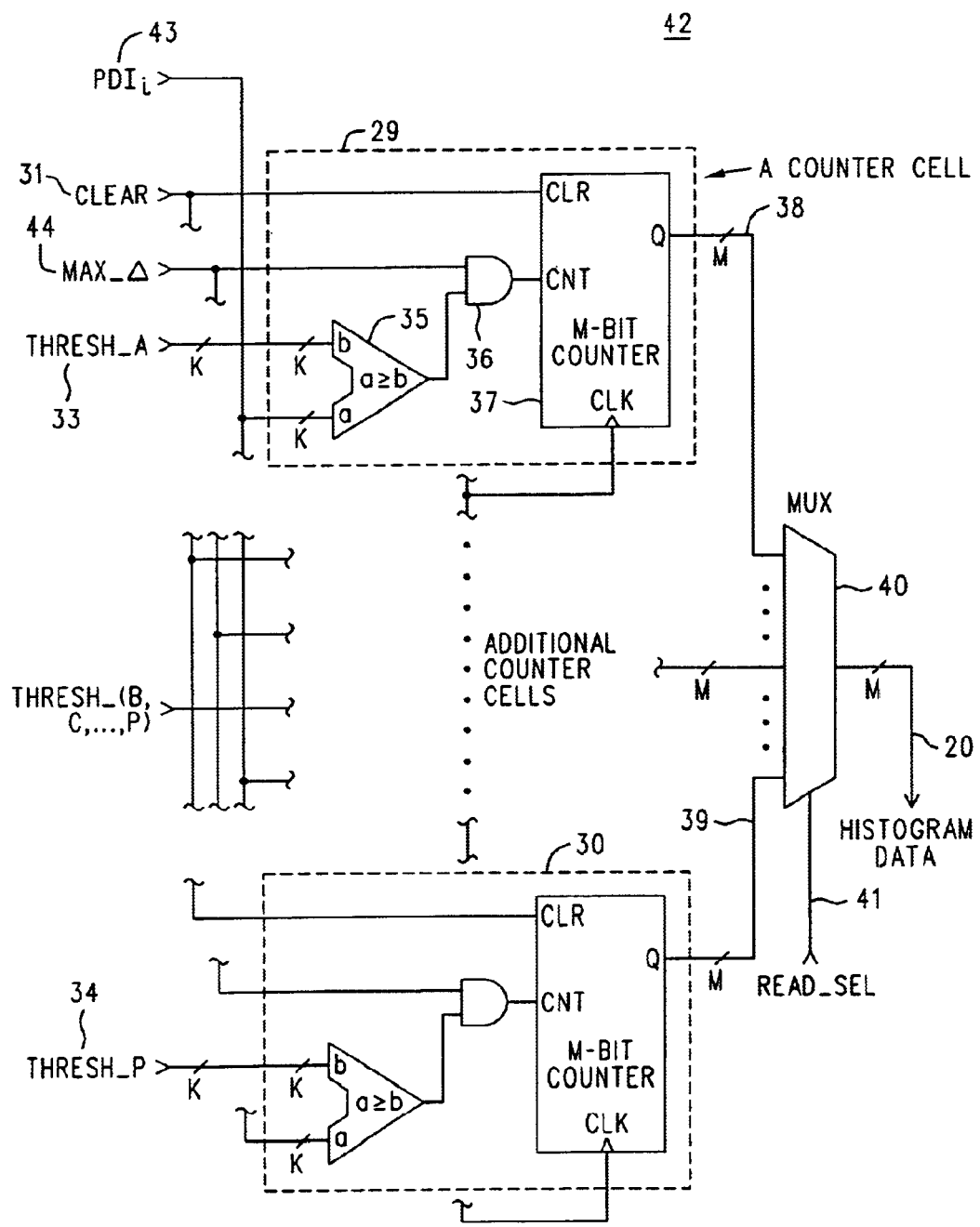
FIG. 3 is simplified block diagram of an alternate complexity detector circuit for FIG. 1.

FIG. 3 depicts a simplified block diagram 42 for an alternate embodiment of the complexity detection circuit discussed above in connection with FIG. 2. Much of FIG. 3 is the same, and as a convenience to the reader, and to emphasize that certain functions remain unchanged in their use and manner of operation, we have repeated (left unchanged) the reference numbers for those elements that are in direct correspondence. In brief, FIG. 2 had a circuit arrangement (register 24 and summer 25) that produced $\Delta_i$ as the various PDI$_i$ were retrieved from a packet. This is a device to capture the minimum sampled data value associated with the packet (when MIN_PDI is TRUE) and then subtract that from the maximum sampled data value associated with the same packet (when MAX_PDI is TRUE). There might be several $\Delta_i$ produced, but the only one that will be acted on in the Counter Cells 29 is the one that is associated with MAX_PDI. This arrangement is appropriate when the Variable Decimation Mechanism 11 merely identifies the maximum and minimum values, but does not supply their difference.

Now suppose that the Variable Decimation Mechanism 11 does indeed supply that difference. That is, the value for $\Delta_i$ that we seek when PDI_MAX is TRUE is actually one of the PDI$_i$, and its presence is indicated by a signal MAX_$\Delta$ 44. To do this involves a change in the operation of the decimation mechanism and a change in the format of the packets. To represent the change in packet format we have changed the reference number of PDI$_i$ in FIG. 3 to be 43. We may or may not chose to retain the notion of MIN_PDI and MAX_PDI and their associated PDI$_i$. The signal MAX_$\Delta$ 44 may be generated by any one of the techniques described for the generation of MIN_PDI 26 and MAX_PDI 32. In light of the foregoing, it is readily appreciated that decimation mechanism (not shown) is supplying the particular instance of PDI$_i$ (corresponding to the $\Delta_i$ of largest value) that is to be compared to the various thresholds. Thus it is that the balance of FIG. 3 is the same as FIG. 2.

In the VERILOG listings for the APPENDICES that follow, there is described a single channel sixteen-threshold complexity detector, re-configurable for two channels of eight thresholds. The threshold comparison is performed in the manner shown in FIG. 2 (i.e., using a≧b). The HISTOGRAM_DATA that results must be separated, as described above.

I claim:

1. A method of selecting the complexity of a compressed version of a digitized waveform, the method comprising the steps of:

(a) partitioning the digitized waveform into n-many segments, each segment containing a plurality of digital values;

(b) finding, for each $i_{th}$ segment of the partitioned digitized waveform of step (a), 1≦i≦n, a magnitude $\Delta_i$, equaling the maximum value within that $i_{th}$ segment minus the minimum value within that $i_{th}$ segment;

(c) compressing the partitioned digitized waveform of step (a) by replacing the plurality of digital values within each $i_{th}$ segment of the partitioned digitized waveform of step (a) with a replacement value;

(d) selecting a plurality of thresholds distributed along an amplitude range for the magnitudes $\Delta_i$;

(e) creating a histogram whose cells have abscissas that are the intervals between adjacent thresholds selected in step (d) and whose ordinates are the number of times, over all of the n-many segments, that each of the various $\Delta_i$ met a selected comparison with each of the intervals;

(f) repeating steps (a)–(e) a plurality of times for the same digitized waveform, each repetition performed with a different trial value for n; and (g) selecting a preferred value of n based upon a comparison of the corresponding histograms produced from the repetition of step (e) by step (f).

2. A method as in claim 1 wherein the selecting in step (d) produces an exponential distribution of the thresholds.

3. A method as in claim 1 wherein the selecting performed in step (g) further comprises the step of, for each histogram, computing a figure of merit by dividing a summation of selectively weighted histogram cell amplitudes by the number of segments.

4. A method as in claim 1 further comprising the step of using in a selected operation the compressed version of the waveform obtained by an execution of steps (a) through (e) with the preferred value of n selected in step (g).

5. A method as in claim 4 wherein the selected operation involves a change in a degree of zoom for a trace displayed on an oscilloscope.

6. A method as in claim 4 wherein the selected operation involves a panning operation for a trace displayed on an oscilloscope.

7. A method as in claim 4 wherein the selected operation involves a waveform arithmetic performed upon one or more waveforms applied to an oscilloscope.

8. A method of selecting the complexity of a decimated version of a waveform having signal amplitude excursions and whose non-decimated version is represented by a digitized acquisition record of sampled values, the method comprising the steps of:

(a) selecting a trial decimation factor n, according to which n-many consecutive samples that comprise a decimation sample width in the digitized acquisition record are represented in a trial decimated version of the waveform by a corresponding decimation value;

(b) decimating the digitized acquisition record according to the trial decimation factor n selected in step (a), to produce a decimated version expressed as a sequence of k-many packets, each packet including for its associated decimation sample width, an item indicating a minimum sampled value, and an item indicating a maximum sampled value;

(c) selecting a plurality of j-many thresholds forming a partition of an expected maximum signal amplitude excursion of the waveform;

(d) for each $i_{th}$ packet, $1 \leq i \leq k$, in the sequence thereof for a trial decimation:

(1) finding an amount $\Delta_i$ by which the maximum sampled value in the packet exceeds the indicated minimum sampled value; and (2) comparing each $\Delta_i$ against each of the j-many thresholds;

(e) counting for each threshold, the number of times that each $\Delta_i$ produces an affirmative comparison in step (d)(2);

(f) forming a histogram whose respective cells have as an abscissa the intervals between adjacent thresholds selected in step (c) and as an ordinate the number of times counts counted in step (e) within the intervals;

(g) repeating steps (a)–(f) a plurality of times for the same digitized waveform, each repetition performed with a different trial value for n; and (h) selecting a preferred value of n based upon a comparison of the corresponding histograms produced from the repetition of step (f) by step (g).

9. A method as in claim 8 wherein the selecting in step (c) produces an exponential distribution of the thresholds.

10. A method as in claim 8 wherein the selecting performed in step (h) further comprises the step of, for each histogram, computing a figure of merit by dividing a summation of selectively weighted histogram cell amplitudes by the number of packets.

11. A method as in claim 8 further comprising the step of using in a selected operation the decimated version of the waveform obtained by an execution of steps (a) through (f) with the preferred value of n selected in step (h).

12. A method as in claim 11 wherein the selected operation involves a change in a degree of zoom for a trace displayed on an oscilloscope.

13. A method as in claim 11 wherein the selected operation involves a panning operation for a trace displayed on an oscilloscope.

14. A method as in claim 11 wherein the selected operation involves a waveform arithmetic performed upon traces displayed upon an oscilloscope.

15. Apparatus responsive to a decimated version of a waveform, the decimated version represented by a sequence of packets, the content of each packet in the sequence of packets including two or more packet items that replace and describe a sequence of consecutively sampled values previously in the waveform and suppressed during decimation, the two or more packet items in each packet being a maximum sampled value and also a minimum sampled value that precedes the maximum sampled value in the packet, the apparatus comprising:

a first register coupled to receive the sequence of packets and the packet items within a present packet in the sequence of packets and capture the minimum sampled value associated with the present packet;

a first subtraction circuit, coupled to receive the captured minimum sampled value, coupled to receive the sequence of packet items associated with the present packet, and that forms at an output amounts $\Delta_i$ by which values of any other packet items in the present packet exceed the captured minimum sampled value;

a plurality of counter cells, each containing a comparator having a first input coupled to the output of the subtraction circuit at which is formed $\Delta_i$, a second input coupled to a signal having a threshold value associated with the counter cell containing the comparator, and having a comparison output that is TRUE when $\Delta_i$ is greater than or equal to the threshold value associated with the counter cell, each counter cell also containing a counter having a counter output and also having a counter input coupled to a count signal that increments the counter when both the comparison output is TRUE and a count enable signal applied to the counter cell indicates that the present packet item in the present packet is the maximum sampled value, each counter cell also having a CLEAR input that clears the counter in the counter cell; and a data switching circuit having the same number of data inputs as there are counter cells, each data input coupled to the counter output for a respective counter cell, the data switching circuit having a data output, and also having a control input that indicates which one of the data inputs is to appear as the data output.

16. Apparatus as in claim 15 wherein data appearing at the data output of the data switching circuit is histogram data indicative of an amount of waveform complexity and the apparatus is a waveform complexity detector for an oscilloscope.

17. Apparatus responsive to a decimated version of a waveform, the decimated version represented by a sequence of packets, the content of each packet in the sequence of packets including one or more packet items among which is a difference packet item whose value is the difference between the maximum and minimum sampled values that occurred in a sequence of consecutively sampled values previously in the waveform, suppressed during decimation and corresponding to the packet, the difference packet item accompanied by an indicator signal MAX_$\Delta$ that distinguishes the difference packet item from any other packet items in the packet, the apparatus comprising:

a plurality of counter cells, each containing a comparator having a first input coupled to receive the packet items in the sequence of packets, a second input coupled to a signal having a threshold value associated with the counter cell containing the comparator, and having a comparison output that is TRUE whenever the value of the packet item at the first input is greater than or equal to the threshold value associated with the counter cell, each counter cell also containing a counter having a counter output and also having a counter input coupled to a count signal that increments the counter when both the comparison output is TRUE and the indicator signal MAX_$\Delta$ is present, each counter cell also having a CLEAR input that clears the counter in the counter cell; and a data switching circuit having the same number of data inputs as there are counter cells, each data input coupled to the counter output for a respective counter cell, the data switching circuit having a data output, and also having a control input that indicates which one of the data inputs is to appear as the data output.

18. Apparatus as in claim 17 wherein data appearing at the data output of the data switching circuit is histogram data indicative of an amount of waveform complexity and the apparatus is a waveform complexity detector for an oscilloscope.

* * * * *

UNITED STATES PATENT AND TRADEMARK OFFICE
CERTIFICATE OF CORRECTION

PATENT NO. : 6,934,646 B2  
DATED : August 23, 2005  
INVENTOR(S) : Montijo

It is certified that error appears in the above-identified patent and that said Letters Patent is hereby corrected as shown below:

Column 16,
Line 61, after "$\Delta_i$" delete ",".

Column 18,
Line 2, after "(e)" insert -- lie --.

Signed and Sealed this

Sixth Day of December, 2005

JON W. DUDAS
*Director of the United States Patent and Trademark Office*